(12) United States Patent
Tsividis (10) Patent No.: US 7,280,059 B1
(45) Date of Patent: Oct. 9, 2007

(54) SYSTEMS AND METHODS FOR MIXING DOMAINS IN SIGNAL PROCESSING

(75) Inventor: Yannis Tsividis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 11/133,748

(22) Filed: May 19, 2005

Related U.S. Application Data (60) Provisional application No. 60/573,682, filed on May 20, 2004.

(51) Int. Cl.
*H03M 1/00* (2006.01)

(52) U.S. Cl. ........................ 341/126; 341/144
(58) Field of Classification Search ........ 341/110–170; 455/130, 136, 138; 375/329, 316
See application file for complete search history.

(56) References Cited

U.S. PATENT DOCUMENTS

| | | | |
|---|---|---|---|
| 5,568,142 A * | 10/1996 | Velazquez et al. | 341/126 |
| 6,177,893 B1 * | 1/2001 | Velazquez et al. | 341/118 |
| 6,339,390 B1 * | 1/2002 | Velazquez et al. | 341/120 |
| 6,388,594 B1 * | 5/2002 | Velazquez et al. | 341/120 |
| 6,418,327 B1 * | 7/2002 | Carey et al. | 455/562.1 |
| 6,473,013 B1 * | 10/2002 | Velazquez et al. | 341/120 |
| 6,714,604 B1 * | 3/2004 | Tsurumi et al. | 375/329 |
| 6,741,847 B1 * | 5/2004 | Claxton et al. | 455/306 |
| 6,771,198 B2 * | 8/2004 | Azadet | 341/110 |
| 7,054,452 B2 * | 5/2006 | Ukita | 381/92 |
| 7,146,316 B2 * | 12/2006 | Alves | 704/233 |
| 7,206,255 B2 * | 4/2007 | Ukita | 367/38 |
| 2002/0187762 A1 * | 12/2002 | Whikehart et al. | 455/130 |

* cited by examiner

*Primary Examiner*—Lam T. Mai
(74) *Attorney, Agent, or Firm*—Wilmer Cutler Pickering Hale and Dorr (57) ABSTRACT

Signal processors that incorporate two or more domains in the design are provided. In certain embodiments, nonlinear processing is combined with linear processing. For example, in some embodiments, the signal processors may include a preprocessor, a plurality of analog filters and an adder. In other embodiments, digital bit waveforms are directly filtered by analog filters. For example, in some embodiments, the signal processors may include a digital signal processor or an analog-to-digital converter, a plurality of analog filters and a binary weighted adder.

64 Claims, 7 Drawing Sheets

SYSTEMS AND METHODS FOR MIXING DOMAINS IN SIGNAL PROCESSING

CROSS-REFERENCE TO RELATED APPLICATION

This application claims the benefit of U.S. Provisional Patent Application No. 60/573,682, filed May 20, 2004, which is hereby incorporated by reference herein in its entirety.

FIELD OF THE INVENTION

This invention relates to systems and methods where domains are mixed when constructing signal processors. More particularly, this invention relates to systems and methods for mixed domain signal processing which involve combining nonlinear processing with linear processing and directly filtering digital bit waveforms by analog filters.

BACKGROUND OF THE INVENTION

Signal processing may involve modification, amplification and/or interpretation of various signals. These signals may include audio, video, speech, data, communication, geophysical, analog, digital and numerous other types of signals. These signals may be processed in many different ways and signal processing generally may be broken into categories (e.g., digital signal processing, analog signal processing, linear signal processing, nonlinear signal processing, continuous-time signal processing and discrete-time signal processing). Typically, certain signal processing categories, such as digital signal processing and analog signal processing, are not mixed together because the techniques for processing the signals via either of these methods may be quite different.

Nevertheless, with the advent of very large scale integration (VLSI) in the manufacture of integrated circuits on semiconductor chips, is possible to include both analog and digital circuits on the same chip, resulting in so-called "mixed-signal" systems. Such systems may typically be divided into clearly digital and clearly analog sub-systems, connected through analog-to-digital and digital-to-analog converters. The converters are used to switch the signal from one signal domain to another. However, it may be desirable to provide for systems where two or more domains, not limited to analog and digital, are mixed together, possibly without converters. In this context, the term "domain" is liberally taken to mean linear, nonlinear, analog, digital, continuous-time, discrete-time, etc. These thoroughly mixed systems may be able to perform the same as a traditionally separated system, but the mixed systems may be able to provide a greater degree of flexibility in processing signals.

SUMMARY OF THE INVENTION

In accordance with the present invention, systems and methods for mixed-domain signal processing are provided. In certain embodiments, nonlinear processing is combined with linear processing. In other embodiments, digital bit waveforms are directly filtered by analog filters.

Thus, in accordance with the present invention, certain embodiments comprise a preprocessor for decomposing the continuous-time analog signal into a plurality of decomposed signals, a plurality of analog filters that each receive and filter one of the decomposed analog signals to produce one of a plurality filtered analog signals and an adder for combining the filtered analog signals into an output analog signal.

Further in accordance with the present invention, certain embodiments comprise a first device that produces a plurality of binary signals, a plurality of analog filters that each receive and filter one of the plurality of binary signals and that output a plurality of filtered signals and a binary weighted adder that receives the plurality of filtered signals and produces an analog output signal.

Still further in accordance with the present invention, certain embodiments comprise decomposing the continuous-time analog signal into a plurality of decomposed analog signals, receiving and filtering at least one of the plurality of decomposed analog signals to produce one of a plurality of filtered analog signals, and adding the plurality of filtered analog signals together to produce an output analog signal.

Yet still further in accordance with the present invention, certain embodiments comprise producing a plurality of binary signals, receiving and filtering at least one of the plurality of binary signals to produce one of a plurality of filtered signals and adding the plurality of filtered signals together to produce an analog output signal.

Yet still further in accordance with the present invention, certain embodiments comprise means for decomposing the continuous-time analog signal into a plurality of decomposed analog signals, means for receiving and filtering at least one of the decomposed analog signals to produce one of a plurality filtered analog signals and means for combining the filtered analog signals into an output analog signal.

Yet still further in accordance with the present invention, certain embodiments comprise means for producing a plurality of binary signals, means for receiving and filtering at least one of the plurality of binary signals and outputting at least one of a plurality of filtered signals and means for producing an analog output signal from the plurality of filtered signals.

BRIEF DESCRIPTION OF THE DRAWINGS

The above and other features and advantages of the present invention will be apparent upon consideration of the following detailed description, taken in conjunction with accompanying drawings, in which like reference characters refer to like parts throughout, and in which.

DETAILED DESCRIPTION OF THE INVENTION

In accordance with the present invention, systems and methods for developing signal processors that incorporate two or more domains are disclosed. Some examples of mixed domain signal processing involve combining nonlinear processing with linear processing, directly filtering digital bit waveforms by analog filters and operating digital processors in continuous time. In these examples, the resulting systems may be operating in a way that is conventionally unexpected or counterintuitive because the domains are not typically mixed. However, despite the mixing of the domains in these examples, the resulting systems may still be externally linear and time-invariant if desired.

Typically, in digital signal processing, digital signals are used by the processing components. If a signal to be processed is not a digital signal, but rather an analog signal, then the signal is often decomposed into quantized units that are represented by bits.

Figure 1:
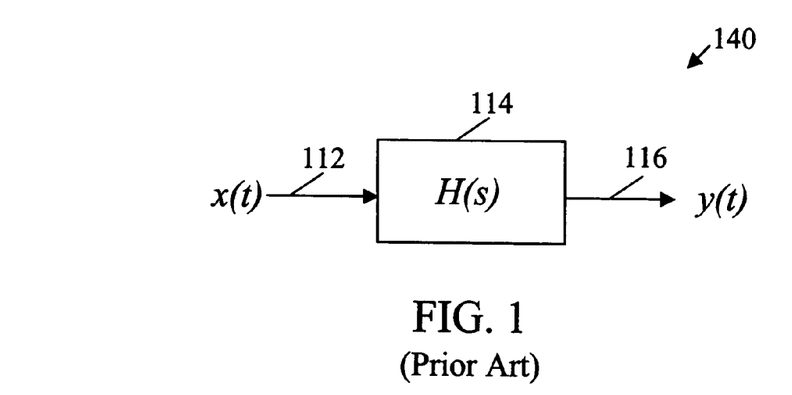
FIG. 1 is a schematic diagram of a linear system in accordance with certain embodiments of the present invention.
Figure 2:
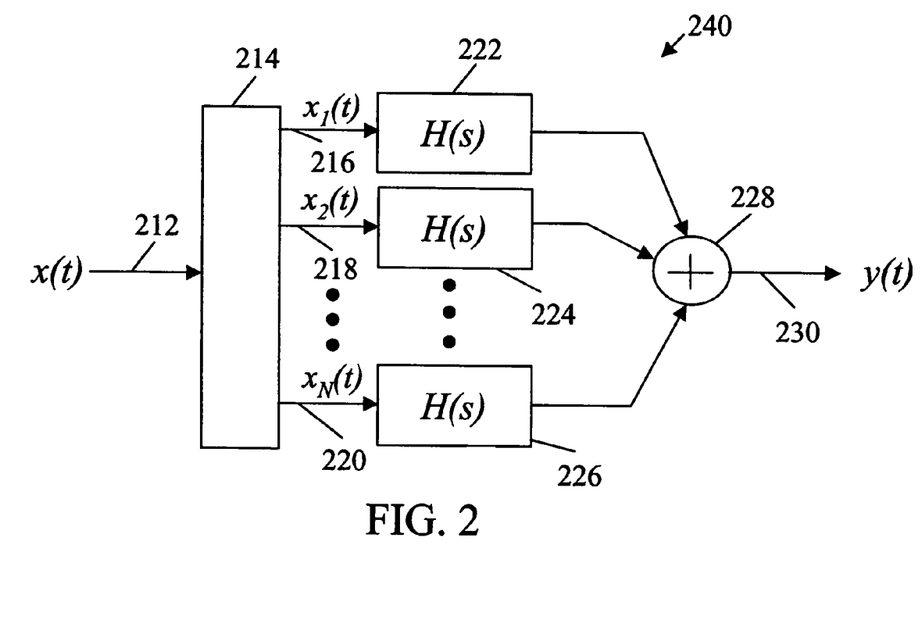
FIG. 2 is a schematic diagram of a system including a preprocessor for signal decomposition in accordance with certain embodiments of the present invention.

A similar decomposition process may be used in analog signal processing whereby the analog signal is broken into smaller pieces for processing. To illustrate this process, a linear filter 114 having a transfer function H(s) that represents the relation between input 112 and output 116 of a signal is shown in FIG. 1. One characteristic of linear filter 114 may be an impulse response h(t) that describes the signal received at output 116 when an impulse is inputted. When input 112 is x(t), the output may be represented as y(t)=x(t)*h(t), where * denotes convolution. Given the equation y(t)=x(t)*h(t), the processing task may be made easier by decomposing the input signal into a set of signals $x_k(t)$, such that:

$$x(t) = \sum_{k=1}^{N} x_k(t), \quad (1)$$

and by individually processing the signal components $x_k(t)$ and then adding the processed components together as shown in system 240 of FIG. 2 (which is one example of the present invention). By applying equation (1) to y(t)=x(t)*h(t), the internal manipulations required become:

$$y(t) = \sum_{k=1}^{N} [x_k(t)^*h(t)] = \left[\sum_{k=1}^{N} x_k(t)\right] * h(t) = x(t)^*h(t). \quad (2)$$

Thus, output 230 is the same as output 116 for a given x(t).

Figure 3:
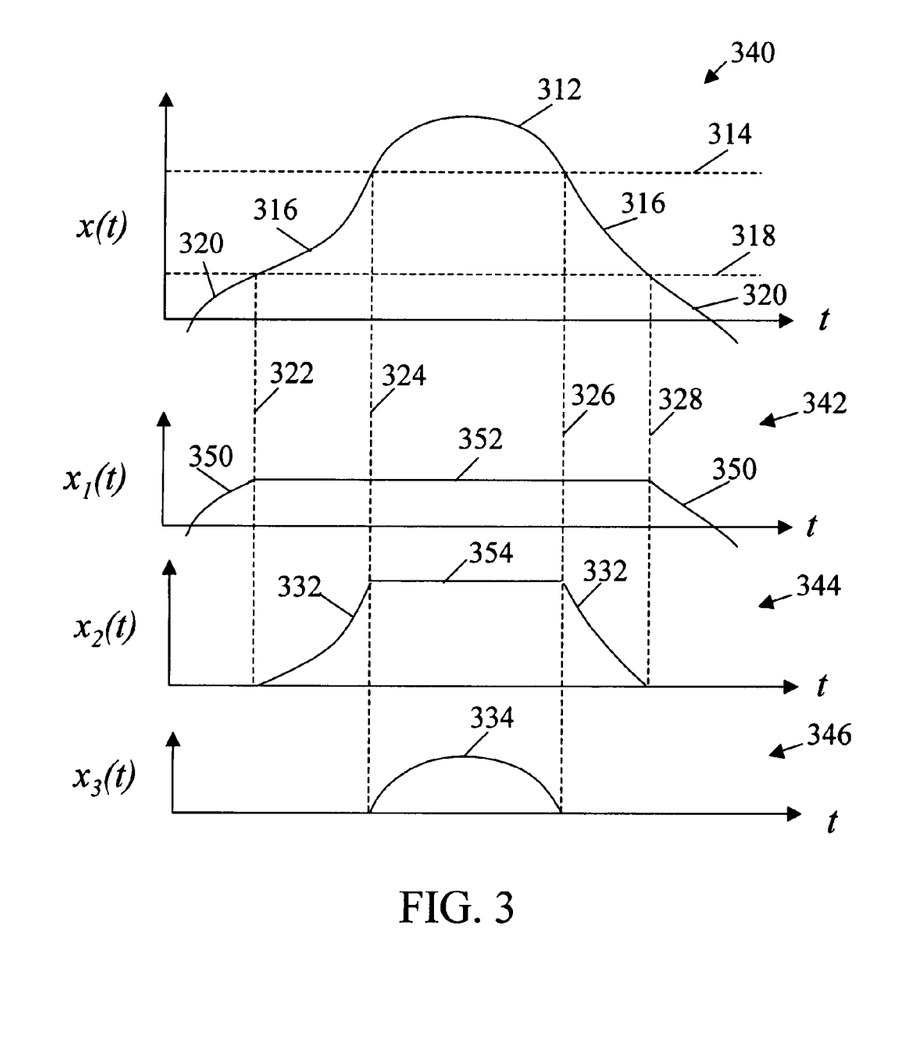
FIG. 3 is a graph illustrating a decomposition of an input signal in accordance with certain embodiments of the present invention.

As illustrated in FIG. 2, system 240 is composed of input 212, preprocessor 214, preprocessor outputs 216, 218 and 220, analog filters 222, 224 and 226, adder 228 and output 230. Preprocessor 214 may take input 212 and decomposes the signal into component parts 342, 344 and 346 as shown in FIG. 3, for example. These component parts are present on outputs 216, 218 and 220. Any suitable technique may be used to decompose input 212, such as using the same technique with a different number of decomposed signals outputted. Preprocessor outputs 216, 218 and 220 are then inputted into analog filters 222, 224 and 226, respectively. Analog filters 222, 224 and 226 filter the signal and may be tailored to filter the particular component outputted from the preprocessor. The outputs of analog filters 222, 224 and 226 are then inputted into adder 228. Adder 228 combines the signal components back into one signal which becomes output 230.

One example of a decomposition may be to decompose an input signal into N equal parts, as shown by $x_k(t)=x(t)/N$, for all k. However, the decomposition is not limited to any particular method. In particular, the components $x_k(t)$ need not be linearly related to x(t). An example of a decomposition completed by preprocessor 214 is shown in FIG. 3. Graph 340 contains a signal x(t) that is divided by lines 314 and 318 into sections 312, 316 and 320. Lines 314 and 318 may be set arbitrarily in the preprocessor as long as equation (1) is satisfied in the decomposition of x(t). Lines 314 and 318 do not have to be equally spaced from one another. Thus, the signal in graph 340 may be decomposed into portions 342, 344 and 346 which would then be outputted from a preprocessor 214. As shown, signal sections 350 in portion 342 vary proportionally to sections 320 until line 318 is crossed between time instances 322 and 328. Between these points, portion 342 saturates in section 352. Signal sections 332 similarly vary in portion 344 to the signal in section 316 while this signal is below line 314. Between time instances 324 and 326, portion 344 saturates in section 354. Signal section 334 varies proportionally in portion 346 to signal section 312 between time instances 324 and 326. When the signal in graph 340 is below level line 314, the output is zero in portion 346. When the signal in graph 340 is below level line 318, the output is zero in portion 344. It should be noted that many different embodiments of the decomposition may be carried out without departing from the essence of the invention. For example, the lines that separate the signal components may be vertical in certain embodiments of the invention; this would result in vertical, rather than horizontal, signal slicing.

Figure 4:
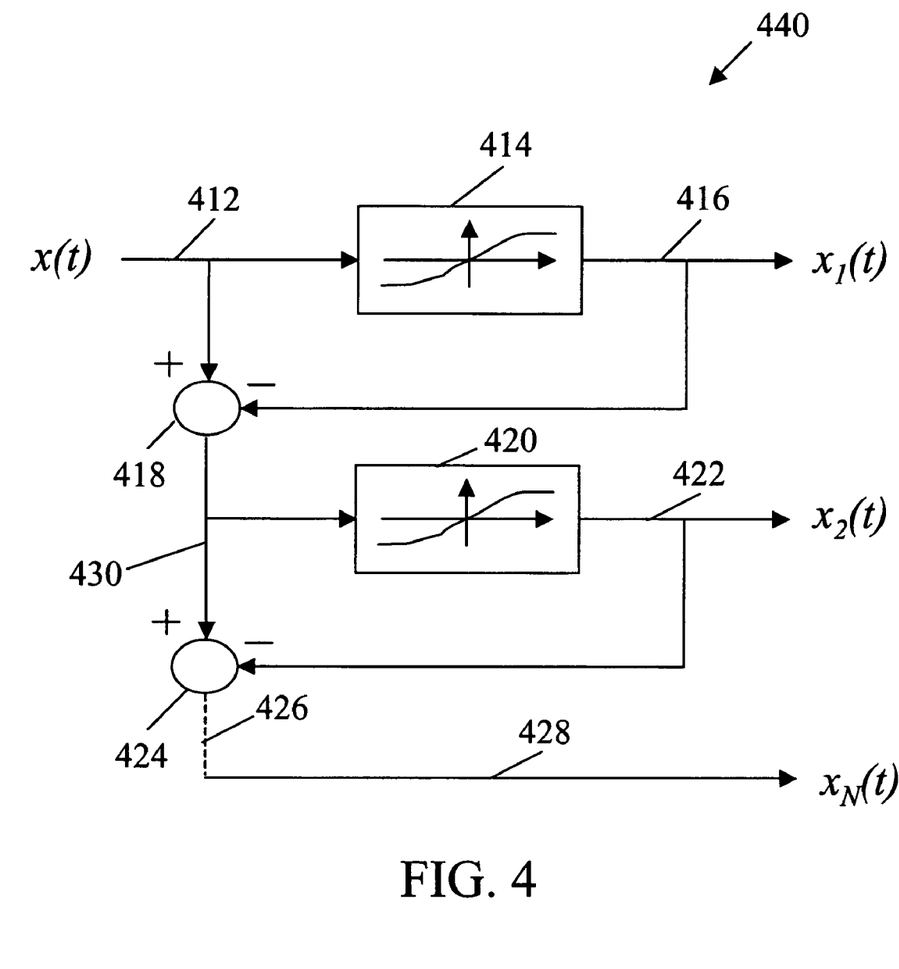
FIG. 4 is a schematic diagram of a system using limiters or compressors for signal decomposition in accordance with certain embodiments of the present invention.

FIG. 4 shows another example of decomposition in accordance with certain embodiments of the invention. System 440 is composed of input 412, limiters 414 and 420 which can be hard or soft, outputs 416, 422 and 428 and subtractors 418 and 424. At input 412 the signal x(t) is passed to limiter 414 to form output $x_1(t)$ 416. Limiter 414 effectively prevents the signal from going above a specified level. In certain embodiments, compressors may be substituted in for the limiters. The compressors may produce the same result as the limiters. However, each compressor may halve the size of the signal and then pass on the remaining portion of the signal to the next compressor. Output 416 is subtracted from input 412 in adder 418 to get the remainder 430 of the signal. In certain embodiments, the subtraction may occur, for example, by adding the two signals in an adder in lieu of subtractor 412, but applying a negative gain to output 416 before the adder. In other embodiments, an adder that can also subtract signals may be used. The output of subtractor 418, remainder 430, is then inputted into limiter 420 which generates output $x_2(t)$ 422 that varies up to the limit level of limiter 420, if such a level exists. Output 422 is then fed to subtractor 424 to be subtracted from remainder 430 to further reduce the signal. Extension 426 represents one or more additional limiters that may be placed according to the necessary specifications of the mechanism. Output 428 is the final output from the last subtractor.

When the decomposition method described above is used in preprocessor 214 in FIG. 2, or in other systems in accordance with certain embodiments of the present invention, the resulting system may have mixed linear and nonlinear domains, yet remain externally linear. The external linearity of the system may not be expected since the internal signals of the system may be nonlinearly related to the input.

A possible advantage of the decompositions described above is that the signal components $x_k(t)$ may be chosen so that certain known characteristics of the signal can be designed for making the original signal x(t) easier to process. An example of this may be an original signal x(t) that maintains a certain shape or range 95% percent of the time, but the other 5% of the time the original signal x(t) is twice as large. Typically in analog circuit design, one analog filter, such as linear filter 114 in FIG. 1 would have to handle the worst case scenario range. Thus, the filter would need to be designed so that it would not be overloaded with signals twice as large, yet still filter the smaller signals according to its specifications. By using analog decomposition, the user can choose to have different filters for the small and large signal cases, making the design of the individual filters easier.

Replacing one filter, such as linear filter 114, with a large number of analog filters, such as filters 222, 224 and 226, may not require more space for the circuit layout in an integrated circuit implementation. Because a linear filter may have to filter a large range in input 112, the design of a single linear filter may be much more complex than designing multiple filters. For example, designing a single filter may require many more components to achieve the desired level of filtering for different input signals. Furthermore, due to the large range of the input signal, the capacitors may need to be large in order to filter the signal throughout the range without excessive noise. This may result in the linear filter taking up more space on the integrated circuit chip and drawing more power.

The following example illustrates how the various signal components, in some embodiments of this invention, may be easier to design. If the input is a current signal, for example, and $x_k(t)=x(t)/N$, then filters 222, 224, 226 and any filters in between may be designed such they are N times noisier without any degradation in the quality of the output signal. As such, under normal operating conditions, each filter's power dissipation and capacitor chip area may be decreased by a factor of N in comparison with filter 114. Therefore, system 240 and system 120 may have similar power and chip area characteristics.

In some embodiments of the current invention, filters 222, 224, 226 and any filters in between may be optimized to reduce the noise and overload levels. While the transfer functions of the filters in system 140 and 240 are identical, the internal design of each may be different. For example, the kth filter in system 240 may be preceded by a gain $A_k$ and followed by a gain $1/A_k$, for any k, without changing the transfer function. Each $A_k$ value may be used to optimize the signal section for the particular filter depending on the intended input signal decomposition. As such, the decomposition in accordance with certain embodiments of the present invention may provide greater flexibility to further tune the signal that may not be achievable with a single filter.

Figure 5:
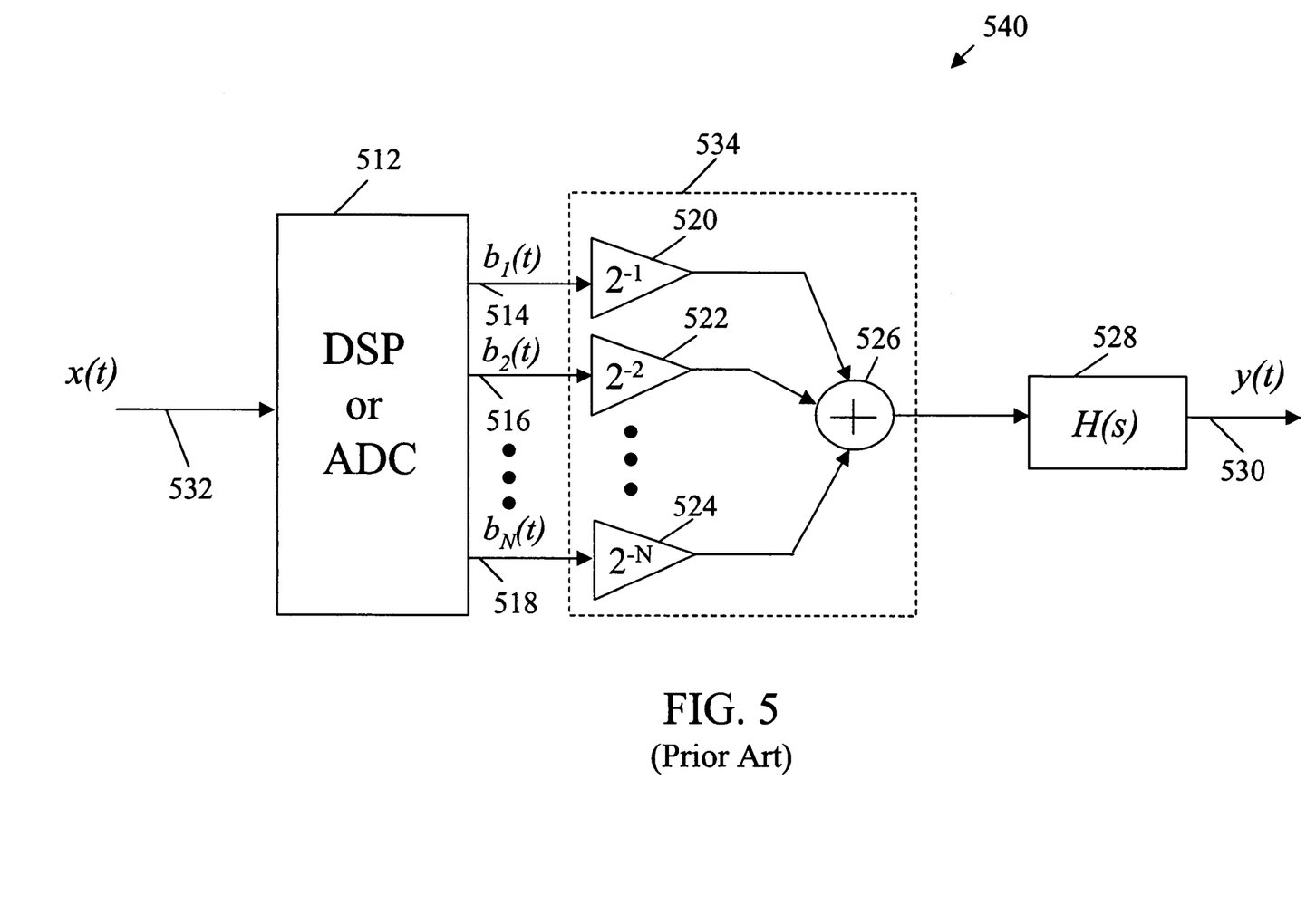
FIG. 5 is a schematic diagram of a mixed analog-digital signal processing system in accordance with certain embodiments of the present invention.

FIG. 5 illustrates a system 540 where a digital signal may be processed and filtered in accordance with known techniques. System 540 is composed of a parallel-output digital signal processor (DSP) or analog-to-digital converter (ADC) device 512, bit outputs 514, 516 and 518, a digital-to-analog converter (DAC) 534 and an analog filter 528. In system 540, input 532 is fed into DSP or ADC 512. If input 532 is a digital signal then device 512 may be a DSP or any other signal modifying mechanism. Alternatively, device 512 may be an ADC and input 532 may be an analog signal. Device 512 produces a number of outputs. For example, outputs 514, 516 and 518 each may be a bit of the N-bit digital signal. Outputs 514, 516 and 518 are then inputted into DAC 534. The inside of DAC 534 may be composed of weighted multipliers 520, 522 and 524 and adder 526. The outputs of each of the weighted multipliers are then summed together in adder 526. The output of adder 526 is then passed through a smoothing analog filter 528. The output of analog filter 528 is a smoothed output 530.

Figure 6:
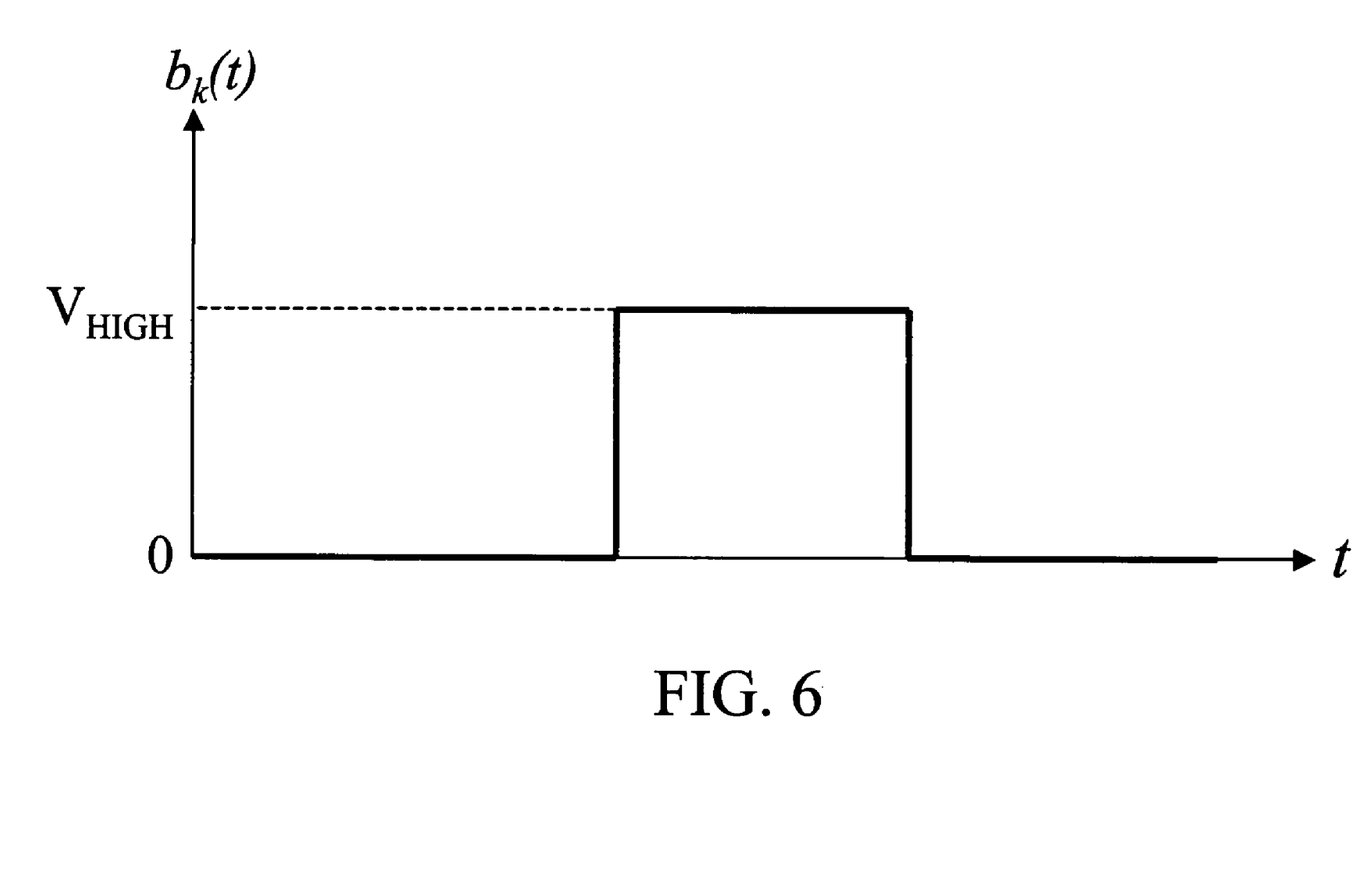
FIG. 6 is a graph of a waveform for the bit outputs of certain systems in accordance with certain embodiments of the present invention.

The outputs 514, 516 and 518 of device 512 are assumed to be sampled-and-held binary-valued voltages with "clean" values of 0 and $V_{HIGH}$, devoid of switching or other noise as shown in FIG. 6. A reference voltage may normally be used within DAC 534 in order to make this possible. DAC 534 may be a binary-weighted adder as shown, without clocking or any other suitable mechanism to complete digital-to-analog conversion. Given these assumptions, the output of the system may be represented as:

$$y(t) = \left[\sum_{k=1}^{N} b_k(t)2^{-k}\right] * h(t) \quad (3)$$

Figure 7:
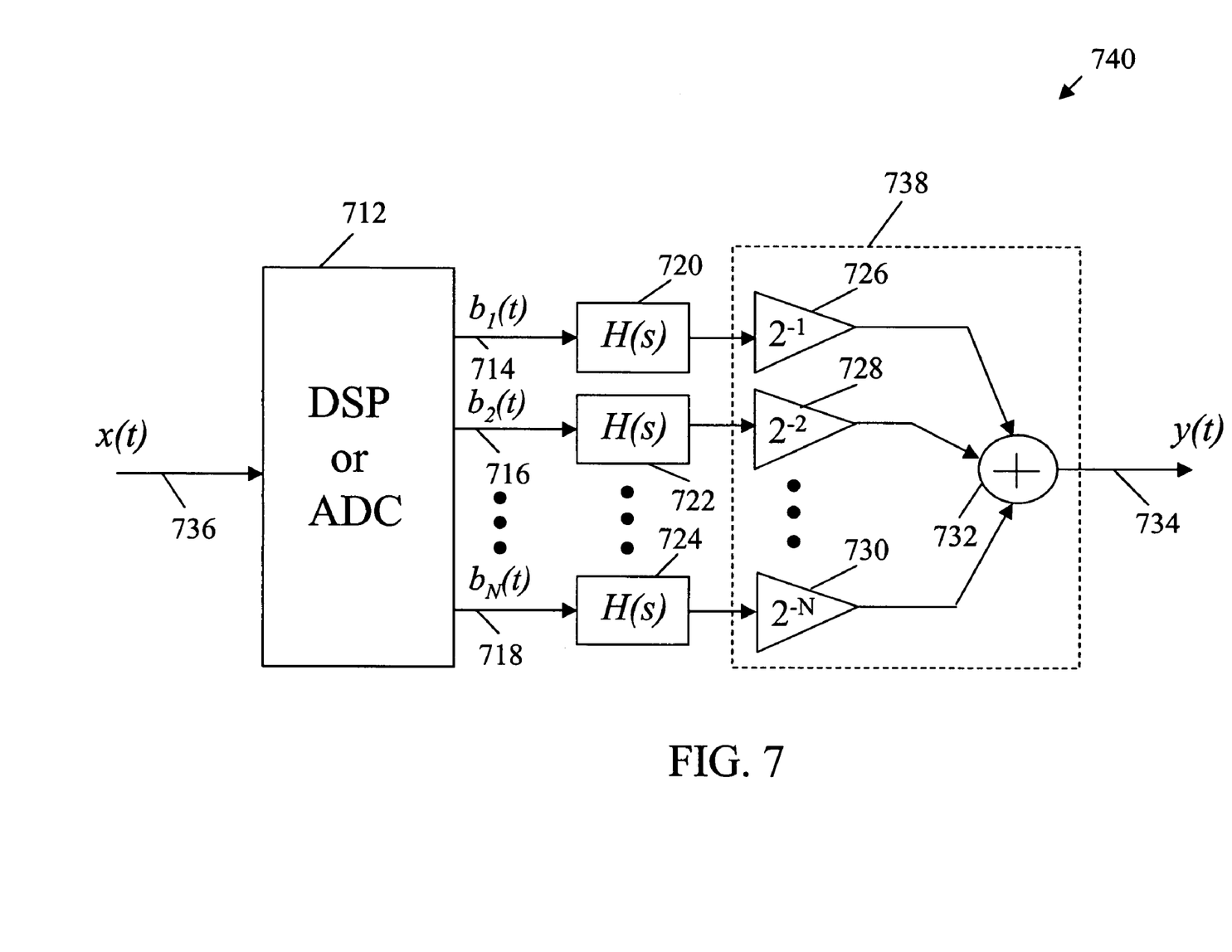
FIG. 7 is a schematic diagram of a system where digital bit waveforms are directly processed by analog filters in accordance with certain embodiments of the present invention.

Due to the linearity of the convolution operator, equation (3) may be written as:

$$y(t) = \left[\sum_{k=1}^{N} b_k(t)2^{-k} * h(t)\right] \quad (4)$$

which is related to the manipulation performed in equation (2). The rearrangement of equation (3) to equation (4) means system 540 may be changed to system 740 as shown in FIG. 7 in accordance with the present invention. In system 740, waveforms representing digital bits are processed directly by analog filters resulting in what might be termed a thoroughly mixed system.

As shown in FIG. 7, system 740 may be composed of device 712, analog filters 720, 722 and 724 and DAC 738. Input 736 may be an analog or a digital signal depending on device 712 used in accordance with certain embodiments of the invention. Device 712 may be a DSP, an ADC, a logic circuit, a microprocessor or any other suitable device for processing a signal. The output of device 712 is a plurality of lines 714, 716 and 718 each carrying a digital bit of data. More lines may be present as indicated by the ellipses shown in FIG. 7. Lines 714, 716 and 718 are passed to analog filters 720, 722 and 724 respectively. Analog filters 720, 722 and 724 then output to binary-weighted adder 738. Binary-weighted adder 738 may be composed of weighting multipliers 726, 728 and 730 whose outputs are then summed in adder 732 to give output 734.

Figure 8:
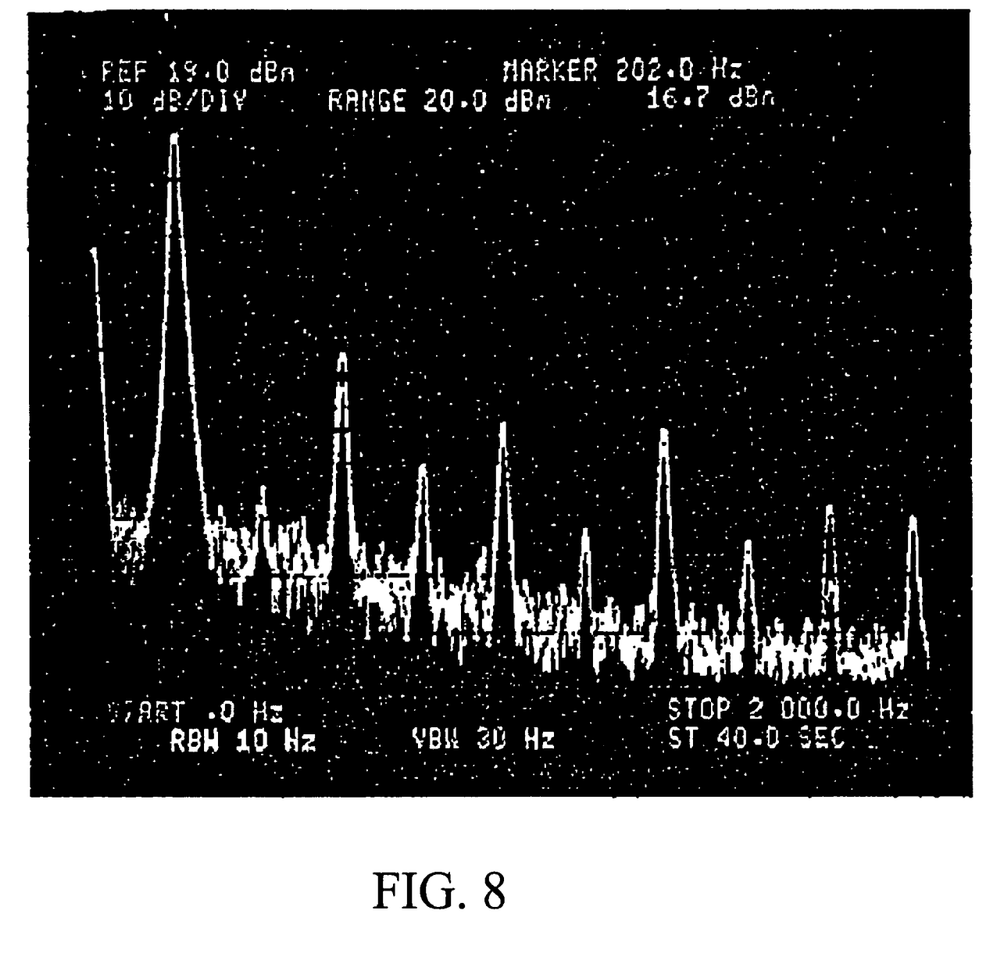
FIG. 8 is a picture of superimposed spectra for the system of FIG. 5 in accordance with certain embodiments of the present invention.

The presence of analog filters 720, 722 and 724 in the place of analog filter 528 may not consume any additional resources in an integrated circuit implementation. As shown in FIGS. 6, 8 and 9, the $k^{th}$ binary-weighting element may have a transfer function $2^{-k}$. The $k^{th}$ element may multiply the noise power of the corresponding filter by the square of its transfer function. Due to this relationship, filters below analog filter 720 (wherein analog filter 720 corresponds to the most significant bit) can be made with proportionally smaller admittance levels without increasing the output noise on the path. The smaller admittance level may entail a smaller power dissipation and capacitance chip area. The combined area and power dissipation may turn out to be similar to that of analog filter 528.

System 740 may have a potential advantage over system 540, in that the filters of system 740 only encounter a specific type of input as shown in FIG. 6. The filters of system 740 can therefore be optimized for such input. In contrast, filter 528 may encounter a wide variety of waveforms, depending on the signal processed. Slew rate problems that may be caused by waveforms of the type illustrated in FIG. 6 can be avoided in system 740 by using filters where no active components are placed at the input of the filters. In fact, the filters of system 740 may not have to satisfy input-output linearity in the general sense of the term, while filter 528 may still have to remain linear. For example, the usual requirement that a filter's output has to scale by a constant $\alpha$ if the filter's input is amplitude-scaled by the constant $\alpha$, may not need to be satisfied because the input to the filter is of the form shown in FIG. 6, which has a fixed amplitude. Despite this fact, superposition may still need to be satisfied for inputs which can be viewed as sums of waveforms like that shown in FIG. 6, with non-overlapping high parts.

In certain embodiments, the linear circuitry in the filters of system 740 may be replaced by nonlinear circuitry which checks at each clock period if a high level is present at the input. If a high level is present, the nonlinear circuitry may produce a waveform approximating the desired pulse response of the filter and add it to the corresponding responses simulated at earlier clock periods. Such a waveform may, for example, be produced as a linear-segment approximation or any other means in accordance with the present invention. The waveform may be generated by current sources, comparators and switches, using known analog signal generation techniques.

EXAMPLES

Systems 540 and 740 were constructed on a breadboard. An unclocked, 4-bit parallel ADC was used, implemented using a resistor string, a reference voltage, comparators and sequential logic. Binary-weighted adder 534 and binary-weighted adder 738 was an op-amp based binary-weighted adder. Second-order Sallen-Key low-pass filters were used with component tolerances matched to within 0.5% of one another. The outputs of the ADC were buffered with unity-gain buffers using 741 op amps, so low-frequency signals were used in order to ensure that the slewing transitions in the bit waveforms were limited to a very small part of the signal period. The filters were designed for a cutoff frequency of 530 Hz.

The frequency response of the two systems matched within 0.2 dB and the output spectra were similarly well matched in certain embodiments of the invention. Component mismatches were introduced in the filters. The mismatches had the largest effect when present in the most significant bit (MSB) path. Smaller mismatches had a negligible effect on the frequency response. The mismatches affected the amplitude of the harmonics at the output (which were mainly due to the 4-bit quantization of the ADC).

FIG. 8 shows the output spectra for a 200 HZ input signal. The results for the two cases are shown superimposed. The first spectra was without intended mismatches and the second case involved mismatches of 5% for a resistor and capacitor in the MSB filter. An increase by a few dB in the level of the $3^{rd}$ and $7^{th}$ harmonic was observed along with a decrease in the level of the $9^{th}$ harmonic. The large mismatches were used in order to make the effect visible, but it is noted that, on an integrated implementation, the achievable matching may be much better.

Other embodiments, extensions, and modifications of the ideas presented above are comprehended and within the reach of one versed in the art upon reviewing the present disclosure. Accordingly, the scope of the present invention in its various aspects should not be limited by the examples and embodiments presented above. The individual aspects of the present invention, and the entirety of the invention should be regarded so as to allow for such design modifications and future developments within the scope of the present disclosure. The present invention is limited only by the claims which follow.

What is claimed is:

1. A system for filtering a continuous-time analog signal comprising:
   a preprocessor for decomposing the continuous-time analog signal into a plurality of decomposed analog signals;
   a plurality of analog filters that each receive and filter one of the plurality of decomposed analog signals to produce one of a plurality of filtered analog signals; and
   an adder for combining the plurality of filtered analog signals into a continuous-time output analog signal.

2. The system of claim 1, wherein the preprocessor comprises:
   a limiter that receives the continuous-time analog signal and outputs one of the plurality of decomposed analog signals; and
   a subtractor that subtracts the one of the plurality of decomposed analog signals from the continuous-time analog signal and outputs a remainder signal.

3. The system of claim 2, wherein the remainder signal is another of the plurality of decomposed analog signals.

4. The system of claim 2, wherein the limiter is a hard limiter.

5. The system of claim 2, wherein the limiter is a soft limiter.

6. The system of claim 2, wherein the limiter is implemented using a compressor.

7. The system of claim 2, wherein the subtractor is implemented using an adder with a negative gain on one input.

8. The system of claim 2, wherein the one of the plurality of decomposed analog signals plus the remainder signal equals the continuous-time analog signal.

9. The system of claim 1, wherein the preprocessor comprises:
   a first limiter that receives the continuous-time analog signal and outputs a first one of the plurality of decomposed analog signals;
   a first subtractor that subtracts the first one of the plurality of decomposed analog signals from the continuous-time analog signal and outputs a first remainder signal;
   a second limiter that receives the first remainder signal and outputs a second one of the plurality of decomposed analog signals; and a second subtractor that subtracts the second one of the plurality of decomposed analog signals from the first remainder signal to produce a second remainder signal.

10. The system of claim 1, wherein the preprocessor decomposes the continuous-time analog signal into the plurality of decomposed analog signals, such that a first one of the plurality of decomposed analog signals corresponds to a first range of amplitude values of the continuous-time analog signal and a second one of the plurality of decomposed analog signals corresponds to a second range of amplitude values of the continuous-time analog signal.

11. The system of claim 1, wherein for at least one of the analog filters, the corresponding one of the plurality of decomposed analog signals input to the filter is amplified by a given gain prior to being filtered and the corresponding one of the plurality of filtered analog signals is amplified by the inverse of the given gain.

12. A system for mixed domain signal processing comprising:
a first device that produces a plurality of digital signals;
a plurality of analog filters that each receive and filter one of the plurality of digital signals and that output a plurality of analog filtered signals; and
a binary weighted adder that receives the plurality of analog filtered signals and produces an analog output signal.

13. The system of claim 12, wherein the first device is a digital signal processor.

14. The system of claim 12, wherein the first device is an analog-to-digital converter.

15. The system of claim 14, wherein the analog-to-digital converter is unclocked.

16. The system of claim 15, wherein the analog to digital converter is formed from a resistor string, a reference voltage, a plurality of comparators, and sequential logic.

17. The system of claim 12, wherein the first device is a microprocessor.

18. The system of claim 12, wherein at least one output of the first device is buffered using a unity gain buffer.

19. The system of claim 18, wherein the unity gain buffer is an operational amplifier.

20. The system of claim 12, wherein at least one of the plurality of analog filters is optimized for a particular signal.

21. The system of claim 12, wherein at least one of the plurality of analog filters has no active components at its input.

22. The system of claim 12, wherein the output of at least one of the plurality of analog filters does not scale to a constant when the input of the at least one of the plurality of filters is amplitude-scaled by the constant.

23. The system of claim 12, wherein at least one of the plurality of analog filters contains circuitry that periodically determines if a high level is present, and, when the high level is present, produces a waveform approximating a combination of a desired pulse response and a response associated with previous waveforms.

24. The system of claim 12, wherein binary weighted adder is operational amplifier based.

25. The system of claim 12, wherein the binary weighted adder comprises weighting multipliers and an adder.

26. The system of claim 12, wherein the plurality of digital signals are a plurality of binary signals.

27. A method for filtering a continuous-time analog signal comprising:
decomposing the continuous-time analog signal into a plurality of decomposed analog signals;

receiving and filtering at least one of the plurality of decomposed analog signals to produce one of a plurality of filtered analog signals; and
adding the plurality of filtered analog signals together to produce a continuous-time output analog signal.

28. The method of claim 27, wherein the decomposing comprises:
receiving the continuous-time analog signal and producing one of the plurality of decomposed analog signals; and
subtracting the one of the plurality of decomposed analog signals from the continuous-time analog signal and outputting a remainder signal.

29. The method of claim 28, wherein the remainder signal is another of the plurality of decomposed analog signals.

30. The method of claim 28, wherein the one of the plurality of decomposed analog signals plus the remainder signal equals the continuous-time analog signal.

31. The method of claim 27, wherein the decomposing comprises:
receiving the continuous-time analog signal and producing a first one of the plurality of decomposed analog signals;
subtracting the first one of the plurality of decomposed analog signals from the continuous-time analog signal to produce a first remainder signal;
receiving the first remainder signal and producing a second one of the plurality of decomposed analog signals; and
subtracting the second one of the plurality of decomposed analog signals from the first remainder signal to produce a second remainder signal.

32. The method of claim 27, wherein the decomposing the continuous-time analog signal into the plurality of decomposed analog signals further comprises:
producing a first one of the plurality of decomposed analog signals to correspond to a first range of amplitude values of the continuous-time analog signal; and
producing a second one of the plurality of decomposed analog signals to correspond to a second range of amplitude values of the continuous-time analog signal.

33. The method of claim 27, further comprising:
amplifying the one of the plurality of decomposed analog signals by a given gain prior to filtering; and
amplifying a corresponding one of the plurality of filtered analog signals by the inverse of the given gain after filtering the one of the plurality of decomposed analog signals.

34. A method for mixed domain signal processing comprising:
producing a plurality of digital signals;
receiving and filtering at least one of the plurality of digital signals to produce one of a plurality of analog filtered signals; and
adding the plurality of analog filtered signals together to produce an analog output signal.

35. The method of claim 34, wherein the filtering of at least one of the plurality of digital signals is optimized for a particular signal.

36. The method of claim 34, wherein during the filtering, of at least one of the plurality of binary signals is periodically checked to determine if a high level is present, and, when the high level is present, a waveform approximating a combination of a desired pulse response and a response associated with previous waveforms is produced.

37. The method of claim 34, wherein the adding of the plurality of filtered signals further comprises:

multiplying each of the plurality of analog filtered signals by a corresponding weighting factor to produce a plurality of weighted filtered signals; and adding the plurality of weighted filtered signals to produce the analog output signal.

38. The method of claim 34, wherein the plurality of digital signals are a plurality of binary signals.

39. A system for filtering a continuous-time analog signal comprising:
means for decomposing the continuous-time analog signal into a plurality of decomposed analog signals;
means for receiving and filtering at least one of the decomposed analog signals to produce one of a plurality filtered analog signals; and
means for combining the filtered analog signals into a continuous-time output analog signal.

40. The system of claim 39, wherein the means for decomposing comprises:
means for receiving the continuous-time analog signal and producing one of the plurality of decomposed analog signals; and
means for subtracting the one of the plurality of decomposed analog signals from the continuous-time analog signal and outputting a remainder signal.

41. The system of claim 40, wherein the remainder signal is another of the plurality of decomposed analog signals.

42. The system of claim 40, wherein the means for receiving and producing is a hard limiter.

43. The system of claim 40, wherein the means for receiving and producing is a soft limiter.

44. The system of claim 40, wherein the means for receiving and producing is implemented using a compressor.

45. The system of claim 40, wherein the means for subtracting is implemented using an adder with a negative gain on one input.

46. The system of claim 40, wherein the one of the plurality of decomposed analog signals plus the remainder signal equals the continuous-time analog signal.

47. The system of claim 39, wherein the means for decomposing comprises:
means for receiving the continuous-time analog signal and producing a first one of the plurality of decomposed analog signals;
means for subtracting the first one of the plurality of decomposed analog signals from the continuous-time analog signal to produce a first remainder signal;
means for receiving the first remainder signal and producing a second one of the plurality of decomposed analog signals; and
means for subtracting the second one of the plurality of decomposed analog signals from the first remainder signal to produce a second remainder signal.

48. The system of claim 39, wherein the means for decomposing the continuous-time analog signal into the plurality of decomposed analog signals decomposes the continuous-time analog signal such that a first one of the plurality of decomposed analog signals corresponds to a first range of amplitude values of the continuous-time analog signal and a second one of the plurality of decomposed analog signals corresponds to a second range of amplitude values of the continuous-time analog signal.

49. The system of claim 39, further comprising:
means for amplifying the one of the plurality of decomposed analog signals by a given gain prior to filtering; and
means for amplifying a corresponding one of the plurality of filtered analog signals by the inverse of the given gain after filtering the one of the plurality of decomposed analog signals.

50. A system for mixed domain signal processing comprising:
means for producing a plurality of digital signals;
means for receiving and filtering at least one of the plurality of digital signals and outputting at least one of a plurality of analog filtered signals; and
means for producing an analog output signal from the plurality of analog filtered signals.

51. The system of claim 50, wherein the means for producing the plurality of digital signals is a digital signal processor.

52. The system of claim 50, wherein the means for producing the plurality of digital signals is an analog-to-digital converter.

53. The system of claim 52, wherein the analog-to-digital converter is unclocked.

54. The system of claim 53, wherein the analog to digital converter is formed from a resistor string, a reference voltage, a plurality of comparators, and sequential logic.

55. The system of claim 50, wherein the means for producing the plurality of digital signals is a microprocessor.

56. The system of claim 50, wherein at least one output of the means for producing the plurality of digital signals is buffered using a unity gain buffer.

57. The system of claim 56, wherein the unity gain buffer is an operational amplifier.

58. The system of claim 50, wherein at least one of the means for filtering is optimized for a particular signal.

59. The system of claim 50, wherein at least one of the means for filtering has no active components at its input.

60. The system of claim 50, wherein the output of at least one of the means for filtering does not scale to a constant when the input of the at least one of the plurality of filters is amplitude-scaled by the constant.

61. The system of claim 50, wherein at least one of the means for filtering contains circuitry that periodically determines if a high level is present, and, when the high level is present, produces a waveform approximating a combination of a desire pulse response and a response associated with previous waveforms.

62. The system of claim 50, wherein means for combining is operational amplifier based.

63. The system of claim 50, wherein the means for combining comprises weighting multipliers and an adder.

64. The system of claim 50, wherein the plurality of digital signals are a plurality of binary signals.

* * * * *